United States Patent
Lee et al.

(10) Patent No.: US 9,570,431 B1
(45) Date of Patent: Feb. 14, 2017

(54) SEMICONDUCTOR WAFER FOR INTEGRATED PACKAGES

(71) Applicant: Taiwan Semiconductor Manufacturing Company, Ltd., Hsin-Chu (TW)

(72) Inventors: Cheng-Te Lee, Chupei (TW); Chung-Yi Yu, Hsin-Chu (TW); Jen-Cheng Liu, Hsin-Chu (TW); Kuan-Chieh Huang, Hsin-Chu (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/811,534

(22) Filed: Jul. 28, 2015

(51) Int. Cl.
*H01L 25/00* (2006.01)
*H01L 29/167* (2006.01)
(Continued)

(52) U.S. Cl.
CPC .......... *H01L 25/50* (2013.01); *H01L 21/0257* (2013.01); *H01L 21/02381* (2013.01); *H01L 21/02532* (2013.01); *H01L 21/02636* (2013.01); *H01L 21/223* (2013.01); *H01L 21/283* (2013.01); *H01L 21/30* (2013.01); *H01L 21/304* (2013.01); *H01L 21/30604* (2013.01); *H01L 21/768* (2013.01); *H01L 24/11* (2013.01); *H01L 24/81* (2013.01); *H01L 29/0684* (2013.01); *H01L 29/167* (2013.01); *H01L 29/36* (2013.01);
(Continued)

(58) Field of Classification Search
CPC ............... H01L 25/50; H01L 21/02381; H01L 21/02532; H01L 21/0257; H01L 21/02636; H01L 21/223; H01L 21/283; H01L 21/30; H01L 21/304; H01L 21/30604; H01L 21/768; H01L 24/11; H01L 24/81; H01L 29/0684; H01L 29/167; H01L 29/36; H01L 2224/1623; H01L 2225/06517; H01L 2225/06548
USPC ....................................................... 257/655
See application file for complete search history.

(56) References Cited

U.S. PATENT DOCUMENTS 5,656,552 A * 8/1997 Hudak ................ H01L 21/6835
257/E21.705
7,564,115 B2 7/2009 Chen et al.
(Continued)

FOREIGN PATENT DOCUMENTS

| TW | 490760 B | 6/2002 |
| TW | 201017820 A | 5/2010 |
| TW | 201210008 A | 3/2012 |

*Primary Examiner* — Fernando L Toledo
*Assistant Examiner* — Adam S Bowen
(74) *Attorney, Agent, or Firm* — Slater Matsil, LLP

(57) ABSTRACT

An embodiment semiconductor wafer includes a bottom semiconductor layer having a first doping concentration, a middle semiconductor layer over the bottom semiconductor layer, and a top semiconductor layer over the middle semiconductor layer. The middle semiconductor layer has a second doping concentration greater than the first doping concentration, and the top semiconductor layer has a third doping concentration less than the second doping concentration. A lateral surface of the bottom semiconductor layer is an external surface of the semiconductor wafer, and sidewalls of the bottom semiconductor layer, the middle semiconductor layer, and top semiconductor layer are substantially aligned.

20 Claims, 10 Drawing Sheets

(51) Int. Cl.
*H01L 29/36* (2006.01)
*H01L 29/06* (2006.01)
*H01L 21/02* (2006.01)
*H01L 21/223* (2006.01)
*H01L 21/30* (2006.01)
*H01L 21/768* (2006.01)
*H01L 21/306* (2006.01)
*H01L 21/304* (2006.01)
*H01L 21/283* (2006.01)
*H01L 23/00* (2006.01)

(52) U.S. Cl.
CPC ............... *H01L 2224/16235* (2013.01); *H01L 2225/06517* (2013.01); *H01L 2225/06548* (2013.01)

(56) References Cited

U.S. PATENT DOCUMENTS

| | | | |
|---|---|---|---|
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 2010/0044826 A1 | 2/2010 | Farooq et al. | |
| 2011/0317050 A1 | 12/2011 | Shirono et al. | |
| 2014/0001645 A1 | 1/2014 | Lin et al. | |
| 2014/0225258 A1 | 8/2014 | Chiu et al. | |
| 2014/0252572 A1 | 9/2014 | Hou et al. | |
| 2015/0263096 A1* | 9/2015 | Yu | H01L 29/165 257/77 |
| 2015/0372005 A1* | 12/2015 | Yon | H01L 27/11582 257/5 |

\* cited by examiner

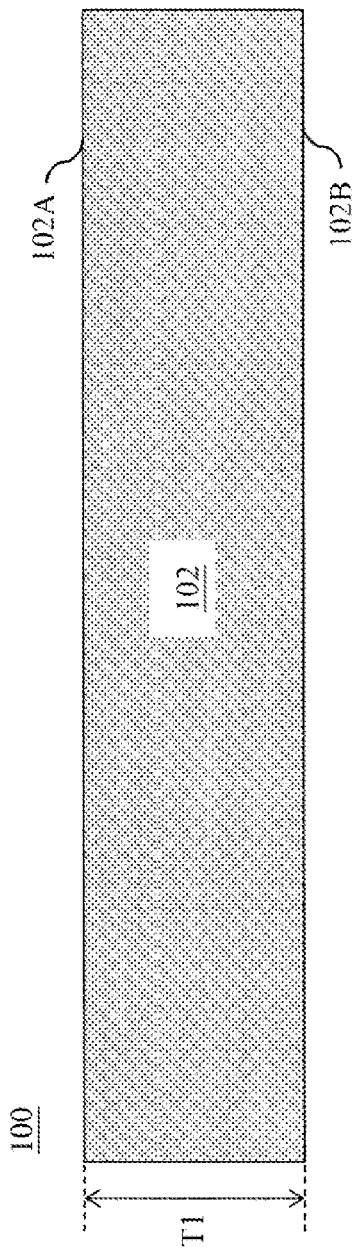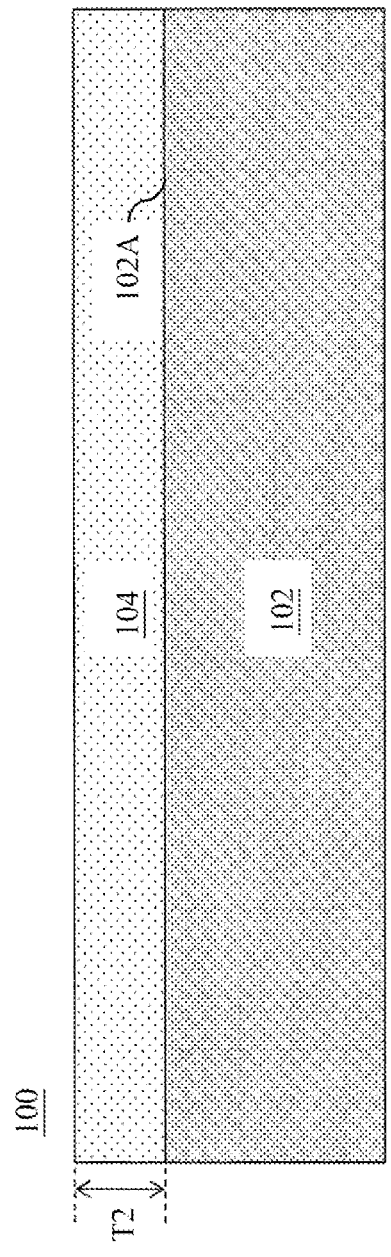
Fig. 1
Fig. 2

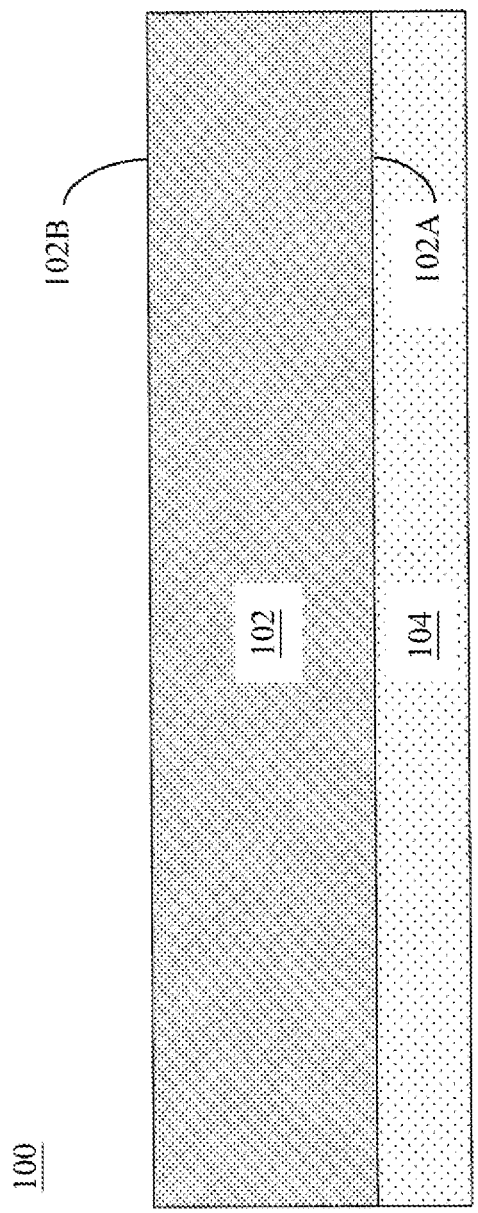

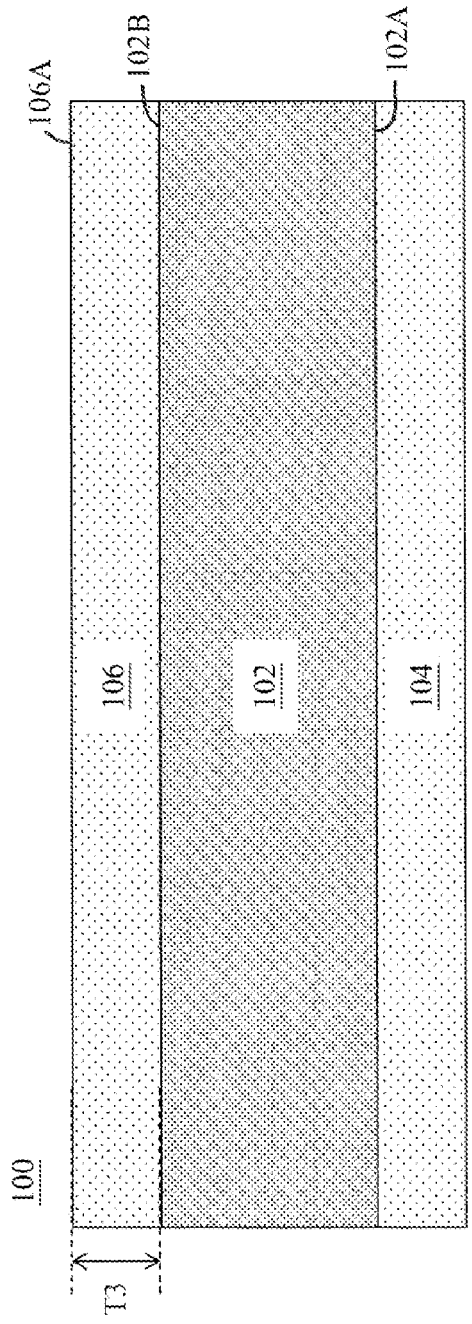
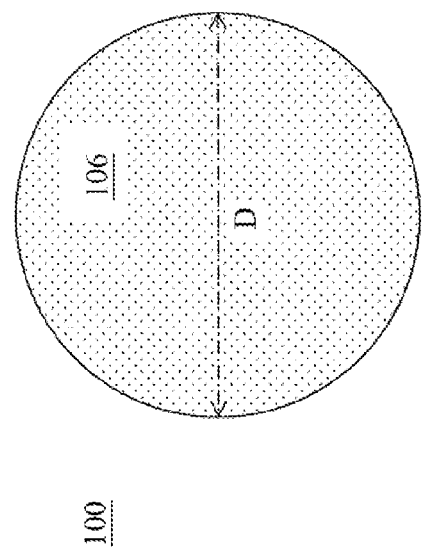
Fig. 4A
Fig. 4B

SEMICONDUCTOR WAFER FOR INTEGRATED PACKAGES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4A, and 4B illustrate varying views of intermediary stages of manufacturing a semiconductor wafer in accordance with some embodiments.

DETAILED DESCRIPTION

Figure 5:
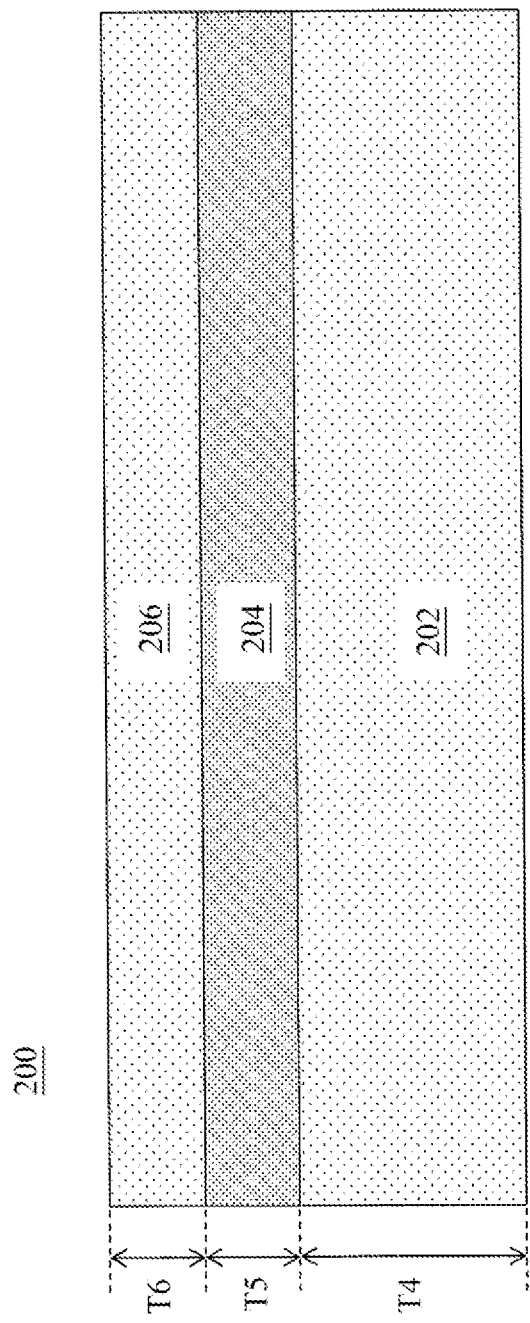
FIG. 5 illustrates a cross-sectional view of a semiconductor wafer in accordance with another embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described herein within a certain context, namely bonding two wafers in a wafer-to-wafer bonding application. Other embodiments can be directed to other applications, such as, multiple wafer bonding where more than two wafers are bonded together in a device package, for example.

Various embodiments include a semiconductor wafer, a method for forming the semiconductor wafer, and a method for including the semiconductor wafer in a wafer bonding application. The semiconductor wafer includes a middle semiconductor layer having a relatively high dopant concentration disposed between top and bottom semiconductor layers having lower dopant concentrations than the middle semiconductor layer. Due to the relatively high dopant concentration of the middle semiconductor layer, the middle semiconductor layer may be especially susceptible to undesirable dopant diffusion (sometimes referred to as auto doping) during various temperature processes (e.g., high temperature processes) for forming an integrated device package. For example, these processes may include forming electrical circuitry (having electrical components and/or interconnect layers) over the top semiconductor layer and bonding another package component (e.g., another wafer) to the semiconductor wafer. In various embodiments, the bottom semiconductor layer is included to reduce this auto doping effect during such processes. Furthermore, the bottom semiconductor layer may comprise a semiconductor material (e.g., silicon), which may be similar to or the same as the material of the top and middle semiconductor layers (e.g., silicon). Thus, the thermal characteristics (e.g., emissivity) of the bottom semiconductor layer is similar to the top and middle semiconductor layers, and the bottom semiconductor layer may reduce diffusion without significantly changing other characteristics (e.g., thermally-affected characteristics) of the wafer, such as warpage, photo overlay alignment, film deposition rate, film etch rate, and the like.

After various processes are performed on the wafer (e.g., after bonding the other package component), a thinning process may be applied to reduce an overall thickness of the resulting device package. The thinning process may include an etching process to remove at least portions of the middle semiconductor layer. The etching process may include a chemical etchant that etches the middle semiconductor layer at a faster rate than the top semiconductor layer. For example, the chemical etchant may be selected to etch higher dopant concentration materials (e.g., the middle semiconductor layer than lower dopant concentration materials (e.g., the top semiconductor layer). Thus, the top semiconductor layer may be used an etch stop layer, and both bottom and middle semiconductor layers may be removed to provide a low-profile device package. Thus, various layers in an embodiment semiconductor wafer are used as etching target layers (e.g., during a thinning process) and protection layer (e.g., to reduce dopant diffusion) during intermediary process steps of forming a device package.

FIGS. 1A through 4B illustrate varying views of forming a semiconductor wafer 100 in accordance with an embodiment. Referring first to FIG. 1, a semiconductor layer 102 is provided. Semiconductor layer 102 may be, for example, a bulk silicon substrate. Other substrates, such as a multi-layered or gradient substrate, may also be used. Furthermore, other semiconductor materials may be used for semiconductor layer 102 in addition to or in lieu of silicon, such as germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, semiconductor layer 102 has a thickness T1 of about 700 μm to about 800 μm, for example, although semiconductor layer 102 may have a different thickness in another embodiment. Semiconductor layer 102 may be formed using any suitable process, such as, by Czochralski (CZ) pullers, for example. In the orientation of wafer 100 illustrated in FIG. 1, semiconductor layer 102 includes a top surface 102A and a bottom surface 102B.

Dopants may be doped into semiconductor layer 102 using any suitable process using implantation, diffusion, or the like. In an embodiment, p-type dopants, such as boron, indium, or the like are doped into semiconductor layer 102. In another embodiment, n-type dopants such as arsenic, phosphorous, or the like are doped into semiconductor layer 102. In an embodiment, a concentration of dopants in semiconductor layer 102 is selected to be suitably high so that semiconductor layer 102 may be selectively etched using a suitable etching chemical that etches high dopant materials at a faster rate than low dopant materials. For example, a concentration of dopants implanted into semiconductor layer 102 may be about $1 \times 10^{18}$ cm$^{-3}$ to about $1 \times 10^{20}$ cm$^{-3}$. It has been observed by configuring the dopant concentration of semiconductor layer 102 within this range, semiconductor layer 102 may be selectively etched from other (subsequently formed) semiconductor layers of wafer 100, such as layers 104 and 106 (see FIG. 4A). Due to its relatively high dopant concentration, semiconductor layer 102 may also be referred to as an N+ or P+ substrate depending on the type of impurity implanted. In the completed wafer, semiconductor layer 102 may be a middle semiconductor layer, which is used as an etching layer during a wafer thinning process.

In FIG. 2, a semiconductor layer 104 is formed over surface 102A of semiconductor layer 102. In an embodiment, semiconductor layer 104 is epitaxially grown using a suitable process, such as epitaxial chemical vapor deposition (EPI CVD), molecular beam epitaxy (MBE), liquid phase epitaxy (LPE), vapor phase epitaxy (VPE), selective epitaxial growth (SEG), combinations thereof, or the like. Semiconductor layer 104 may comprise a similar material as semiconductor layer 102. For example, in an embodiment, semiconductor layer 104 comprises silicon. Thus, semiconductor layer 104 may have similar thermal characteristics (e.g., emissivity) as semiconductor layer 102. For example, in wafer testing where an embodiment wafer is subjected to a rapid thermal anneal (RTA) an emissivity of the embodiment wafer was about 0.67, which is similar to a emissivity of a wafer without a bottom protection layer (e.g., semiconductor layer 104). Thus the inclusion of semiconductor layer 104 does not significantly impact various process characteristics of wafer 100 (e.g., warpage, photo overlay alignment, film deposition rate, film etch rate, and the like).

Semiconductor layer 104 may be formed to cover an entire lateral surface of semiconductor layer 102, and sidewalls of semiconductor layers 102 and 104 may be substantially aligned. In an embodiment, semiconductor layer 104 has a thickness T2 of about 1 μm to about 10 μm, for example although other thicknesses may be used in other embodiments. During the epitaxy, desired p-type or n-type impurities may be doped while the growth proceeds. For example, a dopant-containing precursor may be included in the process gases. In some embodiments, the dopant concentration of semiconductor layer 104 is lower than the dopant concentration of semiconductor layer 102. For example, semiconductor layer 104 may comprise a dopant concentration of about $1 \times 10^{15}$ cm$^{-3}$ to about $1 \times 10^{16}$ cm$^{-3}$. In some embodiments, a dopant concentration of semiconductor layer 102 is about three to five exponential orders greater than a dopant concentration of semiconductor layer 104. For example a ratio of a doping concentration of semiconductor layer 102 to a doping concentration of semiconductor layer 104 may be about $10^3$ to about $10^5$.

In the completed wafer 100, semiconductor layer 104 is a bottom semiconductor layer and is used to reduce undesired diffusion of dopants in semiconductor layer 102 during various device package processing steps (e.g., high-temperature processes). For example, a lateral surface of semiconductor wafer 104 may be an external surface of wafer 100. Thus, a thickness of semiconductor layer 104 may be selected to provide sufficient protection to semiconductor layer 102 for the reduction of this auto doping effect. For example, various thicknesses of semiconductor layer 102 may be formed on test wafers, and the test wafers are then subjected to various high-temperature conditions. Diffusion within each test wafer is measured, and a thickness of semiconductor layer 102 may be selected based on the measured diffusion within the test wafers.

In an embodiment, semiconductor layer 104 comprises a substantially constant doping concentration throughout. In another embodiment, semiconductor layer 104 includes multiple semiconductor layers each comprising different doping concentrations. In yet another embodiment, semiconductor layer 104 may be a gradient layer having a continuously changing doping concentration. For example, a doping concentration of semiconductor layer 104 may be greater at an interface with semiconductor layer 102, which decreases towards an external surface of wafer 100 (e.g., the top surface of semiconductor layer 104 in FIG. 2). In such embodiments, a flow-rate of the dopant-containing precursor may be gradually (continuously or abruptly) decreased during the epitaxy.

After semiconductor layer 104 is formed, an orientation of wafer 100 may be flipped as illustrated in FIG. 3. For example, in the illustrated embodiment, semiconductor layer 104 is disposed under semiconductor layer 102. In the new orientation, surface 102B is now a top surface of semiconductor layer 102, and surface 102A is now a bottom surface of semiconductor layer 102.

In FIG. 4A, a semiconductor layer 106 is formed over surface 102B of semiconductor layer 102. In an embodiment, semiconductor layer 106 is epitaxially grown using a suitable process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, or the like. Semiconductor layer 106 may comprise a material similar to semiconductor layers 102 and 104. For example, in an embodiment, semiconductor layer 106 comprises silicon.

Semiconductor layer 106 may be formed to cover an entire lateral surface of semiconductor layer 102, and sidewalls of semiconductor layers 102, 104, and 106 may be substantially aligned. In an embodiment, semiconductor layer 104 has a thickness T2 of about 1 µm to about 10 µm, for example although other thicknesses may be used in other embodiments. During the epitaxy, desired p-type or n-type impurities may be doped while the growth proceeds. In some embodiments, a dopant type (e.g., n-type or p-type) of semiconductor layers 102, 104, and 106 may be the same. For example, a dopant-containing precursor may be included in the process gases. In some embodiments, the dopant concentration of semiconductor layer 106 is lower than the dopant concentration of semiconductor layer 102. For example, semiconductor layer 106 may comprise a dopant concentration of about $1 \times 10^{15}$ cm$^{-3}$ to about $1 \times 10^{16}$ cm$^{-3}$. The dopant concentration of semiconductor layer 106 may be the same or different than the dopant concentration of semiconductor layer 104.

In the completed wafer 100, semiconductor layer 106 is a device substrate, and electrical components (e.g., transistors, capacitors, resistors, diodes, photo-diodes, fuses, and the like) may be formed at a top surface 106A of semiconductor layer 106. Thus, a dopant type and concentration of semiconductor layer 106 may be selected based on the desired electrical components to be subsequently formed. During the formation of such electrical components, semiconductor layer 104 reduces undesirable diffusion of dopants from semiconductor layer 102 into semiconductor layer 106.

In an embodiment, semiconductor layer 106 comprises a substantially constant doping concentration throughout. In another embodiment, semiconductor layer 106 includes multiple semiconductor layers each comprising different doping concentrations. In yet another embodiment, semiconductor layer 106 may be a gradient layer having a continuously changing doping concentration. For example, a doping concentration of semiconductor layer 106 may be greater at an interface with semiconductor layer 102 (e.g., at surface 102B), which decreases towards an external surface of wafer 100 (e.g., surface 106A). In such embodiments, a flow-rate of the dopant-containing precursor may be gradually decreased during the epitaxy.

Thus, an embodiment semiconductor wafer 100 is formed according to some embodiments. Semiconductor wafer 100 includes at least three layers: a top semiconductor layer 106 (e.g., a device substrate), a middle semiconductor layer 102 (e.g., an etching layer), and a bottom semiconductor layer 104 (e.g., a protection layer). Sidewalls of the semiconductor layers 102, 104, and 106 are substantially aligned with each upper semiconductor layer being formed to entirely cover lateral surfaces of lower semiconductor layers. FIG. 4B illustrates a top-down view of wafer 100. As illustrated, wafer 100 may be substantially circular with top semiconductor layer 106 covering entire surfaces of lower semiconductor layers 102 and 104, which may have the same top-view shapes and top-view sizes as semiconductor layer 106. In an embodiment, wafer 100 has a diameter D, which may be about 300 mm, for example. In other embodiments, wafer 100 may comprise a different shape and/or size.

Electrical circuitry may be subsequently formed on a top surface of semiconductor layer 106 as will be described in greater detail below. Another package component (e.g., another wafer) may also be bonded to wafer 100 over semiconductor layer 106. During the formation of such components and bonding of other package components, bottom semiconductor layer 104 reduces diffusion of dopants within semiconductor layer 102. After such components are formed, semiconductor layers 102 and 104 may be removed using mechanical grinding and selective etch back processes as will be explained in greater detail below.

Although the above embodiment describes semiconductor layer 104 (e.g., a protection layer) being formed prior to semiconductor layer 106 (e.g., a device substrate), the process may also be reversed. For example, semiconductor layer 106 may first be epitaxially grown over semiconductor layer 106 prior to forming semiconductor layer 104. Subsequently, an orientation of the wafer is flipped, and semiconductor layer 104 is epitaxially grown over a surface of semiconductor layer 102 opposing semiconductor layer 106. A thickness of semiconductor layer 104 may be selected in accordance with diffusion characteristics of dopants within semiconductor layer 102.

FIG. 5 illustrates a cross-sectional view of a wafer 200 in accordance with another embodiment. Wafer 200 may be substantially similar to wafer 100 except that two semiconductor layers 204 and 206 are epitaxially grown over a bottom semiconductor layer 202. Semiconductor layer 204 may have a higher dopant concentration (e.g., similar to semiconductor layer 102) than semiconductor layers 202 and 206. In an embodiment, semiconductor layer 204 has a dopant concentration of about $1 \times 10^{18}$ cm$^{-3}$ to about $1 \times 10^{20}$ cm$^{-3}$ while semiconductor layers 202 and 206 each have a dopant concentration of about $1 \times 10^{15}$ cm$^{-3}$ to about $1 \times 10^{16}$ cm$^{-3}$. A dopant concentration in each layer may be constant, varying at discrete intervals, or a gradient. Each semiconductor layer 202, 204, or 206 may be a single layer or include multiple layers.

Furthermore, bottom semiconductor layer 202 may be thicker than semiconductor layers 204 and 206. For example, bottom semiconductor layer 202 may have a thickness T4 of about 700 µm to about 800 µm while semiconductor layers 204 and 206 each has a thickness T5 and T6, respectively, of about 1 µm to about 10 µm. The intended function of each semiconductor layer 202, 204, and 206 may be similar to semiconductor layers 104, 102, and 106, respectively. For example, semiconductor layer 202 may be a protection layer to reduce diffusion of dopants in semiconductor layer 204. Semiconductor layer 204 may be an etching layer during a wafer thinning process, and semiconductor layer 206 may be a device substrate for forming electrical components.

Figure 6:
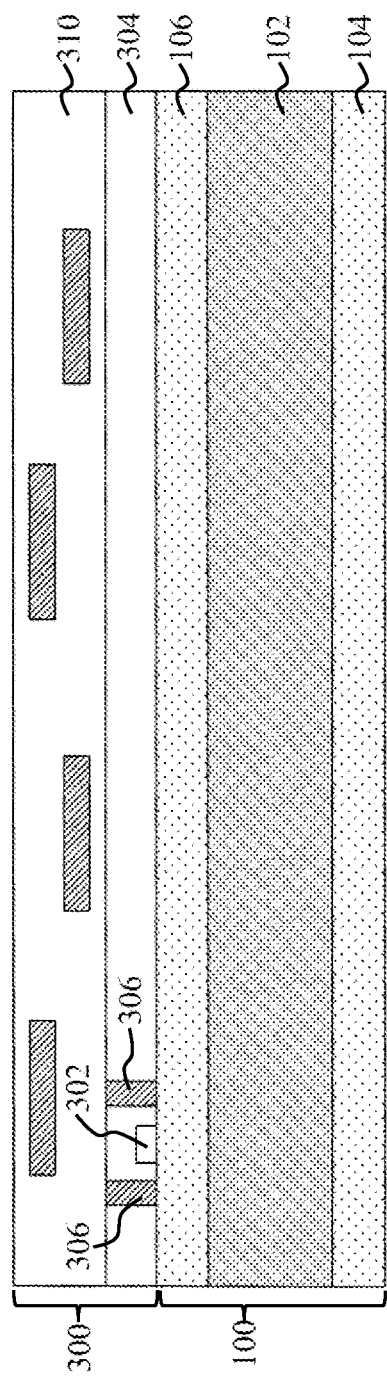
FIGS. 6, 7, 8, 9A, and 9B illustrate cross-sectional views of wafer bonding and thinning in accordance with some embodiments.

FIGS. 6 through 9 illustrate cross-sectional views of various intermediary stages of manufacturing a device package using an embodiment wafer, such as wafer 100. Referring first to FIG. 6, electrical circuitry 300 is formed over a top surface of semiconductor layer 106 of wafer 100. Electrical circuitry 300 formed on semiconductor layer 106 may be any type of circuitry suitable for a particular application. In an embodiment, the circuitry includes electrical components 302 formed on the substrate with one or more dielectric layers overlying electrical components 302. Metal layers may be formed between dielectric layers to route electrical signals between electrical components 302. Electrical components 302 may also be formed in one or more dielectric layers. In an embodiment, semiconductor layer 106 is used to form various active regions (e.g., source/drain regions, well regions, photo diodes and the like) of electrical components while semiconductor layers 102 and 104 may be substantially free of such active regions or components.

For example, electrical components 302 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is an inter-layer dielectric (ILD) 304/inter-metallization dielectric (IMD) layer 306. ILD 304 may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that ILD 304 may comprise a plurality of dielectric layers.

Contacts 308 are formed through ILD 304 to provide an electrical contact to electrical components 302. Contacts 308 may be formed, for example, by using photolithography techniques to deposit and pattern a photoresist material on ILD 304 to expose portions of ILD 304 that are to become the contacts 308. An etch process, such as an anisotropic dry etch process, may be used to create openings in ILD 304. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming Contacts 306 as illustrated in FIG. 6.

One or more additional IMDs 310 and interconnect lines 312 form metallization layers over ILD 304. Generally, the one or more IMDs 310 and the associated metallization layers are used to interconnect the electrical circuitry to each other and to provide an external electrical connection. The IMDs 310 may be formed of a low-K dielectric material, such as fluorosilicate glass (FSG) formed by PECVD techniques or high-density plasma chemical vapor deposition (HDPCVD) or the like, and may include intermediate etch stop layers. External contacts (not shown) may be formed in an uppermost layer.

It should also be noted that one or more etch stop layers (not shown) may be positioned between adjacent ones of the ILD layers, e.g., ILD 304 and the additional IMD layers 110. Generally, the etch stop layers provide a mechanism to stop an etching process when forming vias and/or contacts. The etch stop layers are formed of a dielectric material having a different etch selectivity from adjacent layers, e.g., the underlying wafer 100 and the overlying ILD layers 304/310. In an embodiment, etch stop layers may be formed of SiN, SiCN, SiCO, CN, combinations thereof, or the like, deposited by CVD or PECVD techniques.

Figure 7:
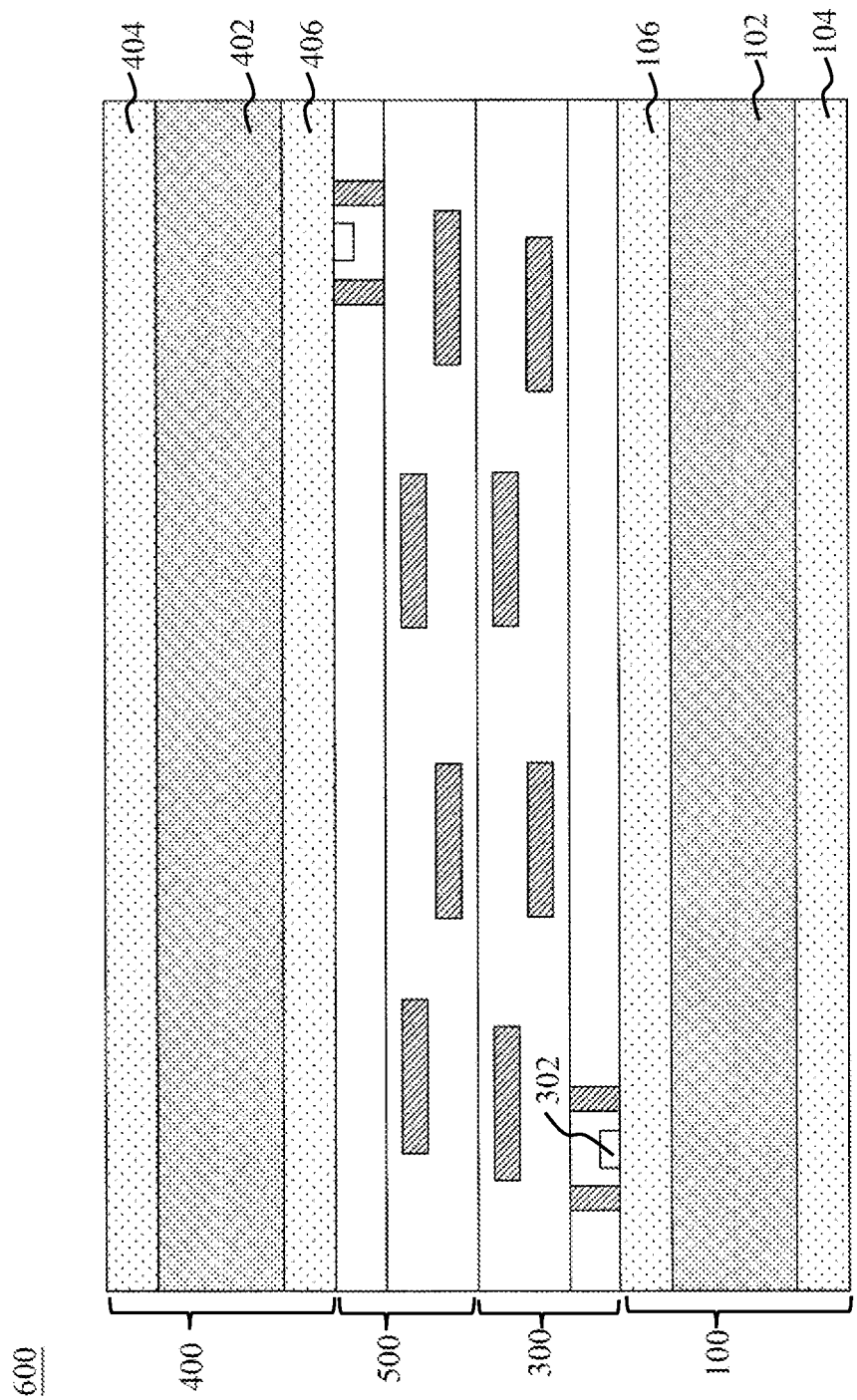

Referring next to FIG. 7, a second semiconductor wafer 400 having electrical circuitry 500 formed thereon is bonded to wafer 100. In an embodiment, wafer 400 may be similar to wafer 100 having a semiconductor layer 406 (e.g., a device layer), a semiconductor layer 402 (e.g., an etching layer), and a semiconductor layer 404 (e.g., a protection layer). A doping concentration of semiconductor layer 402 may be higher than respective doping concentrations of semiconductor layers 404 and 406. In an embodiment, electrical circuitry 500 is bonded to electrical circuitry 300 using a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding, any combinations thereof and/or the like. The resulting device package 600 is illustrated in FIG. 7.

In an embodiment, the wafer 100 and electrical circuitry 300 form a backside sensor illuminated (BSI) or front side sensor illuminated (FSI) CMOS image sensor (CIS), and the wafer 400 and electrical circuitry 500 form a logic circuit, such as an application specific integrated circuit (ASIC) device. In this embodiment, the electrical circuitry 300 includes photo active regions, such as photo-diodes formed by implanting impurity ions into semiconductor layer 106. Furthermore, the photo active regions may be a PN junction photo-diode, a PNP photo-transistor, an NPN photo-transistor or the like. Wafer 400 and electrical circuitry 500 may comprise a logic circuit, an analog-to-digital converter, a data processing circuit, a memory circuit, a bias circuit, a reference circuit, and the like. In an embodiment, device package 600 is a stacked CIS, a stacked logic product, or the like including FSI CIS, BSI CIS, logic circuitry, memory circuitry, high-voltage (HV) circuitry, flash circuitry, analog circuitry, radio-frequency (RF) circuitry, combinations thereof, and the like.

Figure 8:
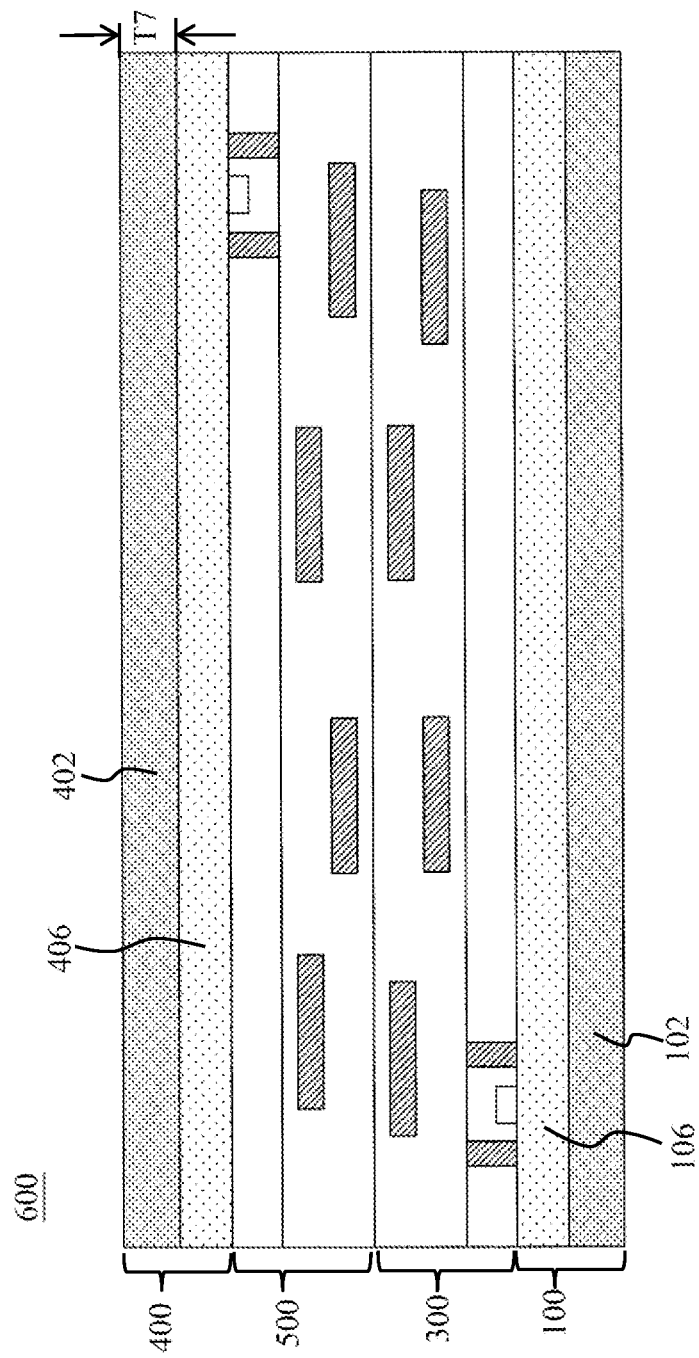

After wafer 100 and wafer 400 are bonded, a thinning process may be applied to the backside of wafer 100 as illustrated by FIGS. 8 and 9. In an embodiment in which semiconductor layer 106 is a BSI sensor, the thinning process serves to allow more light to pass through from the backside of the first substrate to the photo-active regions without being absorbed by the substrate. The thinning process may further be used to achieve a smaller form factor/profile for device package 600. The thinning process may be implemented by using a combination of a mechanical technique (e.g., grinding, polishing, a SMARTCUT® procedure, an ELTRAN® procedure, and the like) and chemical etching. For example, referring to FIG. 8, an initial mechanical thinning is applied to remove portions of wafer 100 and 400. The mechanical thinning may remove semiconductor layers 104 and 404 (e.g., protection layers) and expose semiconductor layers 102 and 402 (e.g., etching layers). Portions of semiconductor layers 102 and 402 may also be removed with some portion of semiconductor layers 102 and 402 remaining. The mechanical thinning may be applied to reduce a total thickness of device package 600 to a desired general range. For example, after the mechanical thinning process, a thickness T7 of wafer 100 or 400 may be about 20 µm to about 30 µm, for example. A thickness of the entire package 600 after thinning may be about 795 µm to about 805 µm. The mechanical thinning process may be applied simultaneously or sequentially to both wafers 100 and 400 in any order. In another embodiment, only one of the wafers 100 or 400 is thinned while the other wafer 100 or 400 is used as a carrier wafer and not thinned. During the mechanical thinning process, semiconductor layers 102 and 402 protect semiconductor layers 106 and 406.

Figure 9A:
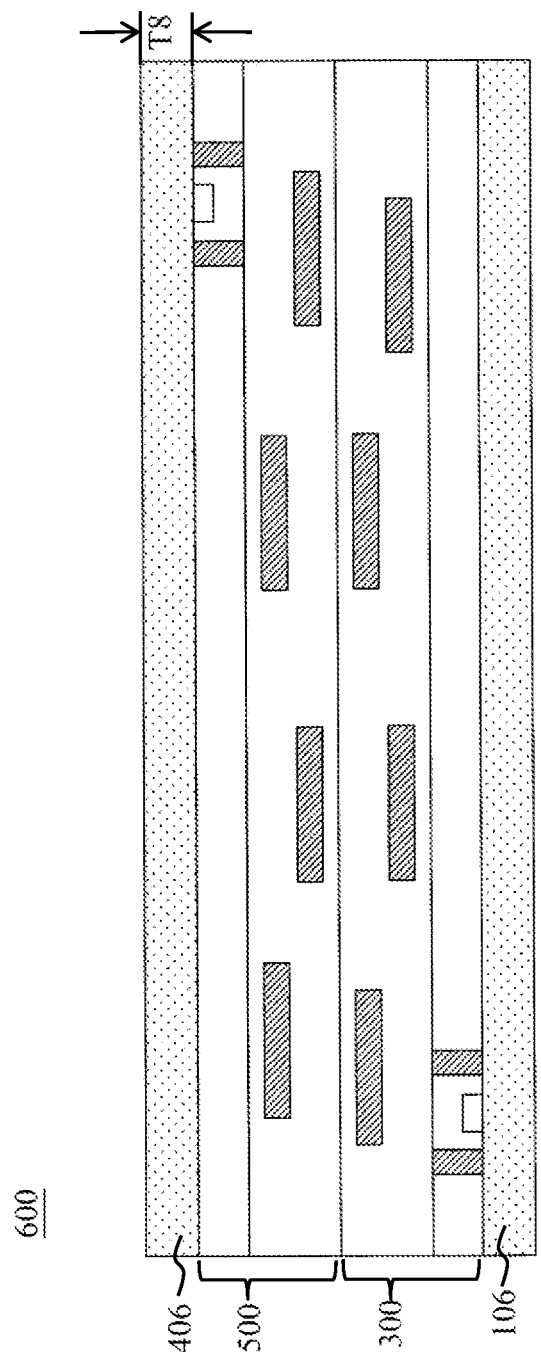
Figure 9B:
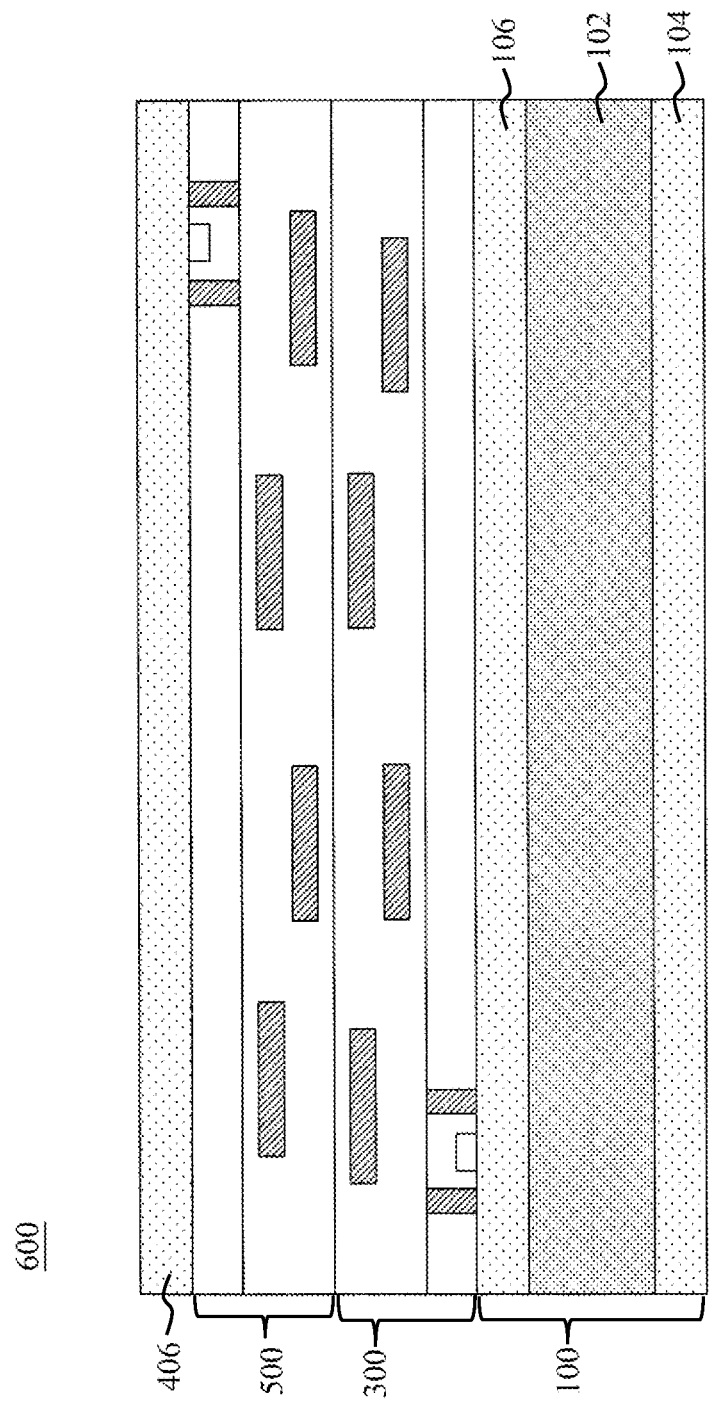

Next, in FIG. 9A, remaining portions of semiconductor layers 102 and 402 are removed using a suitable process, such as chemical etching. The chemical etching process may involve using a chemical etchant that selectively etches semiconductor layers 102 and 402 at a faster rate than semiconductor layers 106 and 406. The chemical etchant may be selected based on dopant type, concentration, and the like of semiconductor layers 102 and 402. For example, the chemical etchant may etch high dopant concentration materials (e.g., semiconductor layers 102 and 402) at a faster rate than lower dopant concentration materials (e.g., semiconductor layers 106 and 106). In some embodiments, the chemical etchant may comprise hydrogen fluoride (HF), nitric acid ($HNO_3$), acetic acid ($CH_3COO$), combinations thereof (e.g., hydrofluoric, nitric, acetic (HNA) acid), or the like. Other chemical etchants may be used in other embodiments. Thus, semiconductor layers 106 and 406 may act as etch stop layers during the chemical etching. Etching semiconductor layers 102 and 402 may be performed simultaneously or sequentially in any order. After etching, a thickness T8 of wafer 100 or 400 may be about 5 μm to about 6 μm, for example. Thus, as described above, semiconductor layers 102 and 402 may be used as etching layers during a wafer thinning process. A thickness of the entire package 600 after thinning may be about 775 μm to about 790 μm, for example. After the wafer thinning process, at least a portion of semiconductor layers 106 and 406 (e.g., layers where electrical components are formed) remain. Furthermore, although both wafers 100 and 400 are thinned in the illustrated embodiment, in another embodiment, only one wafer 100 or 400 is thinned with the other wafer acting as a carrier support substrate as illustrated in FIG. 9B.

Figures 10, 11:
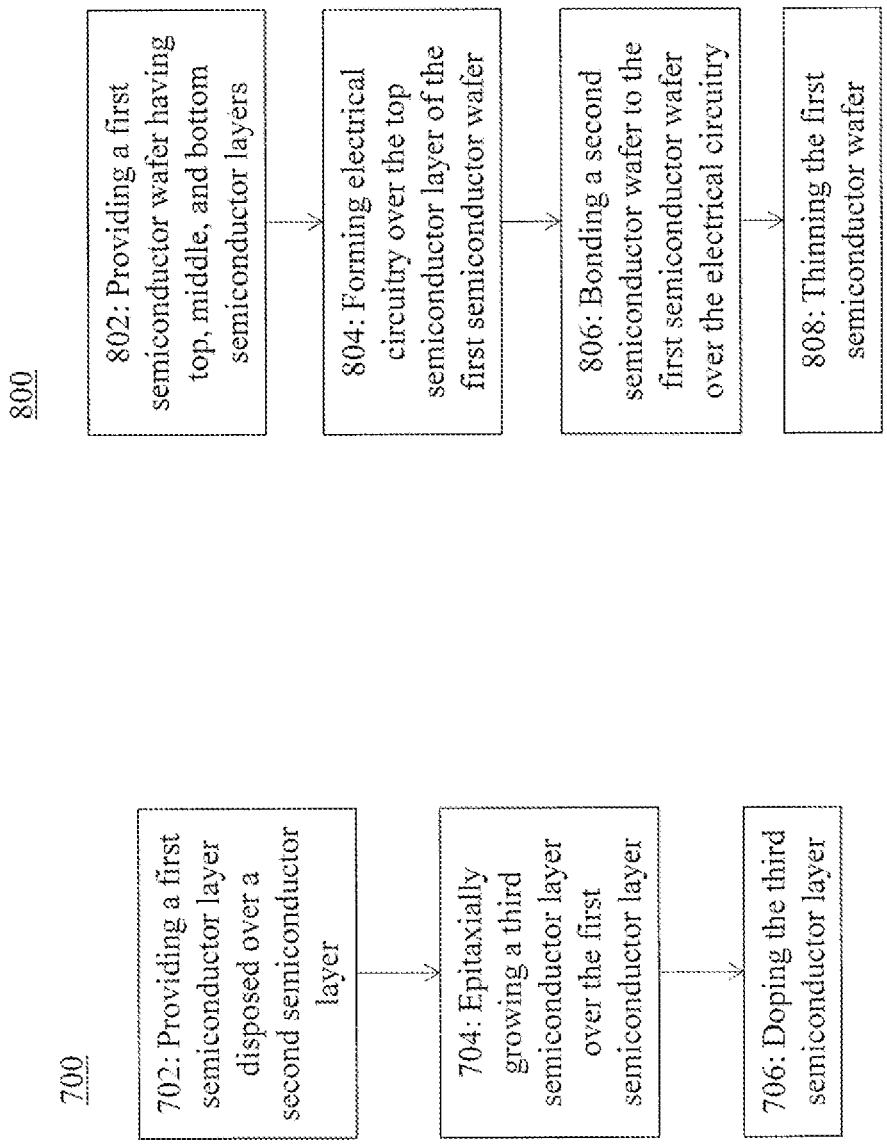
FIG. 10 illustrates a process flow for forming a semiconductor wafer in accordance with some embodiments.
FIG. 11 illustrates a process flow for wafer bonding and thinning in accordance with some embodiments.

FIG. 10 illustrates a process flow 700 for forming a semiconductor wafer according to some embodiments. In step 702, a first semiconductor layer disposed over a second semiconductor layer is provided. The first semiconductor layer has a higher dopant concentration than the second semiconductor layer. In an embodiment, the first semiconductor layer (e.g., layer 204) is epitaxially grown over the second semiconductor layer (e.g., layer 202). In an embodiment, the second semiconductor layer (e.g., layer 104) is epitaxially grown over the first semiconductor layer (e.g., layer 102), and the orientation of the first and second semiconductor layers are then flipped. In step 704, a third semiconductor layer (e.g., layer 106 or 206) is epitaxially grown over a surface of the first semiconductor layer. In an embodiment, the third semiconductor layer is grown over an entire surface of the first semiconductor layer. In step 704, the third semiconductor layer is doped with a lower concentration of dopants than the first semiconductor layer.

FIG. 11 illustrates a process flow 800 for bonding wafers according to some embodiments. In step 802, a first semiconductor wafer (e.g., wafer 100) is provided. The first semiconductor layer includes a middle semiconductor layer (e.g., layer 102) disposed between and having a higher dopant concentration than top (e.g., layer 106) and bottom (e.g., layer 104) semiconductor layers. In step 804, electrical circuitry (e.g., circuitry 300) is formed over the top semiconductor layer. In step 806, a second semiconductor wafer (e.g., wafer 400) is bonded to the first semiconductor wafer over the electrical circuitry. In step 808, the first semiconductor wafer is thinned. The thinning may include applying a mechanical thinning process in combination with a chemical etching. The chemical etching uses a chemical etchant that etches the middle semiconductor layer at a higher rate than the top semiconductor layer, which may be used as an etch stop layer.

Various embodiments as described above include a semiconductor wafer, a method for forming the semiconductor wafer, and a method for including the semiconductor wafer in a wafer bonding application. The semiconductor wafer includes a middle semiconductor layer having a relatively high dopant concentration disposed between top and bottom semiconductor layers having lower dopant concentrations than the middle semiconductor layer. In various embodiments, the bottom semiconductor layer is included to reduce dopant diffusion in the middle semiconductor layer. Furthermore, the bottom semiconductor layer may comprise a semiconductor material (e.g., silicon), which may be similar to or the same as the material of the top and middle semiconductor layers (e.g., silicon). Thus, the thermal characteristics (e.g., emissivity) of the bottom semiconductor layer is similar to the top and middle semiconductor layers, and the bottom semiconductor layer may reduce diffusion without significantly changing other characteristics (e.g., thermally-affected characteristics) of the wafer, such as warpage, photo overlay alignment, film deposition rate, film etch rate, and the like.

The thinning process may include an initial mechanical process to remove the bottom semiconductor layer and expose the middle semiconductor layer. The initial mechanical process may further remove portions of the middle semiconductor layer. Then an etching process may be applied to remove remaining portions of the middle semiconductor layer. The etching process may include a chemical etchant that etches the middle semiconductor layer at a faster rate than the top semiconductor layer. For example, the chemical etchant may be selected to etch higher dopant concentration materials (e.g., the middle semiconductor layer than lower dopant concentration materials (e.g., the top semiconductor layer). Thus, the top semiconductor layer may be used an etch stop layer, and both bottom and middle semiconductor layers may be removed to provide a low-profile device package. Thus, various layers in an embodiment semiconductor wafer are used as etching target layers (e.g., during a thinning process) and protection layer (e.g., to reduce dopant diffusion) during intermediary process steps of forming a device package.

In accordance with an embodiment, a semiconductor wafer includes a bottom semiconductor layer having a first doping concentration, a middle semiconductor layer over the bottom semiconductor layer, and a top semiconductor layer over the middle semiconductor layer. The middle semiconductor layer has a second doping concentration greater than the first doping concentration, and the top semiconductor layer has a third doping concentration less than the second doping concentration. A lateral surface of the bottom semiconductor layer is an external surface of the semiconductor wafer, and sidewalls of the bottom semiconductor layer, the middle semiconductor layer, and top semiconductor layer are substantially aligned.

In accordance with another embodiment, a method for forming a semiconductor wafer includes providing a first semiconductor layer disposed over a second semiconductor layer. The first semiconductor layer has a higher concentration of dopants than the second semiconductor layer. The method further includes epitaxially growing a third semiconductor layer over the first semiconductor layer and doping the third semiconductor layer with a lower concentration of dopants than the first semiconductor layer. Third semiconductor layer and the first semiconductor layer cover an entire top surface of the second semiconductor layer.

In accordance with yet another embodiment, a method includes providing a first semiconductor wafer comprising a bottom semiconductor layer comprising a first dopant concentration, wherein a lateral surface of the bottom semiconductor layer is an external surface of the first semiconductor wafer; a middle semiconductor layer comprising a second dopant concentration greater than the first dopant concentration; and a top semiconductor layer comprising a third dopant concentration less than the second dopant concentration. The method further includes forming electrical circuitry over the top semiconductor layer, bonding a second semiconductor wafer to the first semiconductor wafer over the electrical circuitry; and thinning the first semiconductor wafer. Thinning the first semiconductor wafer includes removing the bottom semiconductor layer to expose the middle semiconductor layer and etching the middle semiconductor layer using a chemical etchant that etches the middle semiconductor layer at a faster rate than the top semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer comprising:
   a bottom semiconductor layer having a first doping concentration of first dopants, wherein a first lateral surface of the bottom semiconductor layer is an external surface of the semiconductor wafer;
   a middle semiconductor layer over the bottom semiconductor layer, wherein the middle semiconductor layer comprises a second doping concentration of second dopants greater than the first doping concentration, wherein the first dopants and the second dopants are of a same type; and
   a top semiconductor layer over the middle semiconductor layer, wherein the top semiconductor layer comprises a third doping concentration less than the second doping concentration, and wherein sidewalls of the bottom semiconductor layer, the middle semiconductor layer, and top semiconductor layer are substantially aligned.

2. The semiconductor wafer of claim 1, wherein a thickness of the bottom semiconductor layer is selected in accordance with a diffusion characteristic of dopants in the middle semiconductor layer.

3. The semiconductor wafer of claim 1, wherein the bottom semiconductor layer comprises a gradient doping concentration.

4. The semiconductor wafer of claim 3, wherein a doping concentration at the first lateral surface of the bottom semiconductor layer is less than a doping concentration at a second lateral surface of the bottom semiconductor layer opposing the first lateral surface of the bottom semiconductor layer.

5. The semiconductor wafer of claim 1, wherein the second doping concentration is about $1\times10^{18}$ cm$^{-3}$ to about $1\times10^{20}$ cm$^{-3}$.

6. The semiconductor wafer of claim 1, wherein the bottom semiconductor layer is thinner than the middle semiconductor layer.

7. The semiconductor wafer of claim 1, wherein the bottom semiconductor layer is thicker than the middle semiconductor layer.

8. The semiconductor wafer of claim 1, wherein the second doping concentration is at least three exponential orders greater than the first doping concentration and the third doping concentration.

9. A method for forming a semiconductor wafer comprising:
   providing a first semiconductor layer disposed over a second semiconductor layer, wherein the first semiconductor layer comprises a higher concentration of dopants than the second semiconductor layer, wherein providing the first semiconductor layer disposed over the second semiconductor layer comprises:
      epitaxially growing the second semiconductor layer over the first semiconductor layer; and
      flipping an orientation of the first semiconductor layer and the second semiconductor layer so that the first semiconductor layer is disposed over the second semiconductor layer; and
   epitaxially growing a third semiconductor layer over the first semiconductor layer; wherein third semiconductor layer and the first semiconductor layer cover an entire top surface of the second semiconductor layer, and wherein epitaxially growing the third semiconductor layer comprises epitaxially growing the third semiconductor layer over a surface of the first semiconductor layer opposing the second semiconductor layer; and
   doping the third semiconductor layer with a lower concentration of dopants than the first semiconductor layer.

10. The method of claim 9, wherein providing the first semiconductor layer disposed over the second semiconductor layer comprises epitaxially growing the first semiconductor layer over the second semiconductor layer.

11. The method of claim 9 further comprising doping the second semiconductor layer by flowing a dopant-containing precursor while epitaxially growing the second semiconductor layer.

12. The method of claim 11, wherein doping the second semiconductor layer comprises gradually decreasing a flow rate of the dopant-containing precursor while epitaxially growing the second semiconductor layer.

13. The method of claim 9 further comprising doping the first semiconductor layer with a concentration of dopants of about $1\times10^{18}$ cm$^{-3}$ to about $1\times10^{20}$ cm$^{-3}$.

14. The method of claim 9, wherein a thickness of the second semiconductor layer is selected in accordance with a diffusion characteristic of dopants in the first semiconductor layer.

15. A method comprising:
   providing a first semiconductor wafer comprising:
      a bottom semiconductor layer comprising a first dopant concentration, wherein a lateral surface of the bottom semiconductor layer is an external surface of the first semiconductor wafer;
      a middle semiconductor layer comprising a second dopant concentration greater than the first dopant concentration; and
      a top semiconductor layer comprising a third dopant concentration less than the second dopant concentration;
   forming electrical circuitry over the top semiconductor layer;
   bonding a second semiconductor wafer to the first semiconductor wafer over the electrical circuitry; and thinning the first semiconductor wafer, wherein thinning the first semiconductor wafer comprises:
  removing the bottom semiconductor layer to expose the middle semiconductor layer; and
  etching the middle semiconductor layer using a chemical etchant that etches the middle semiconductor layer at a faster rate than the top semiconductor layer.

16. The method of claim 15, wherein the bottom semiconductor layer reduces diffusion of dopants in the middle semiconductor layer during forming the electrical circuitry and bonding the second semiconductor wafer.

17. The method of claim 15, wherein removing the bottom semiconductor layer comprises a mechanical thinning process.

18. The method of claim 17, wherein the mechanical thinning process further removes a portion of the middle semiconductor layer.

19. The method of claim 15, wherein the top semiconductor layer is an etch-stop layer during etching the middle semiconductor layer.

20. The method of claim 15, wherein the chemical etchant is selected in accordance with a dopant type and dopant concentration of the middle semiconductor layer.

* * * * *